US011515894B2

(12) United States Patent
Hui

(10) Patent No.: US 11,515,894 B2
(45) Date of Patent: *Nov. 29, 2022

(54) ENHANCED INFORMATION SEQUENCES FOR POLAR CODES

(71) Applicant: Telefonaktiebolaget LM Ericsson (publ), Stockholm (SE)

(72) Inventor: Dennis Hui, Sunnyvale, CA (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 402 days.

This patent is subject to a terminal disclaimer.

(21) Appl. No.: 16/631,357

(22) PCT Filed: Jul. 18, 2018

(86) PCT No.: PCT/IB2018/055351

§ 371 (c)(1),
(2) Date: Jan. 15, 2020

(87) PCT Pub. No.: WO2019/016734

PCT Pub. Date: Jan. 24, 2019

(65) Prior Publication Data

US 2020/0220560 A1 Jul. 9, 2020

Related U.S. Application Data

(60) Provisional application No. 62/534,562, filed on Jul. 19, 2017.

(51) Int. Cl.

*H03M 13/13* (2006.01)
*H04W 88/02* (2009.01)
*H04L 1/00* (2006.01)

(52) U.S. Cl.

CPC ........... *H03M 13/13* (2013.01); *H04L 1/0033* (2013.01); *H04L 1/0036* (2013.01); *H04W 88/02* (2013.01)

(58) Field of Classification Search

CPC ..... H03M 13/13; H04W 88/02; H04L 1/0033; H04L 1/0036

See application file for complete search history.

(56) References Cited

U.S. PATENT DOCUMENTS 11,152,959 B2 * 10/2021 Hui ...................... H03M 13/13
11,159,179 B2 * 10/2021 Hui ...................... H04L 1/0041

(Continued)

FOREIGN PATENT DOCUMENTS

WO 2017 106246 A2 6/2017

OTHER PUBLICATIONS

Channel Polarization: A Method for Constructing Capacity-Achieving Codes for Symmetric Binary-Input Memoryless Channels by Erdal Arikan; IEEE Transactions on Information Theory, vol. 55, No. 7—Jul. 2009.

(Continued)

*Primary Examiner* — April Y Blair
*Assistant Examiner* — Sazzad Hossain
(74) *Attorney, Agent, or Firm* — Sage Patent Group

(57) ABSTRACT

According to some embodiments, a method of operation of a transmit node in a wireless communication system comprises performing polar encoding of a set of K information bits to thereby generate a set of polar-encoded information bits. The K information bits are mapped to the first K bit locations in an information sequence SN. The information sequence SN is a ranked sequence of N information bit locations among a plurality of input bits for the polar encoding where N is equivalent to a code length. A size of the information sequence SN is greater than or equal to K. The information sequence SN is optimized for the specific value of the code length (N). The method may further comprise transmitting the set of polar-encoded information bits.

26 Claims, 8 Drawing Sheets

10

TX NODE
12

POLAR ENCODER
14

TRANSMITTER
16

RX NODE
18

POLAR DECODER
20

RECEIVER
22

(56) References Cited

U.S. PATENT DOCUMENTS

| | | | | |
|---|---|---|---|---|
| 11,212,037 B2 * | 12/2021 | Hui | ........................ | H03M 13/13 |
| 2017/0047947 A1 | 2/2017 | Hong et al. | | |
| 2018/0278268 A1 * | 9/2018 | Jeong | .................... | H04L 1/0041 |
| 2020/0177309 A1 * | 6/2020 | Jang | ...................... | H04L 1/0057 |

OTHER PUBLICATIONS

List Decoding of Polar Codes by Ido Tal and Alexander Vardy—May 2012.

3GPP TS 38.212 v15.1.1; Technical Specification; 3rd Generation Partnership Project; Technical Specification Group Radio Access Network; NR; Multiplexing and channel coding (Release 15)—Apr. 2018.

3GPP TSG RAN WG1 Meeting #86; Gothenburg, Sweden; Source: Huawei, HiSilicon; Title: Polar code design and rate matching (R1-167209)—Aug. 22-26, 2016.

3GPP TSG-RAN WG1 #89; Hangzhou, P.R. China; Source: Qualcomm Incorporated; Title: FRANK polar construction for NR control channel and performance comparison (R1-1709178)—May 15-19, 2017.

3GPP TSG-RAN WG1 NR Ad-Hoc#2; Qingdao, P.R. China; Source: Qualcomm Incorporated; Title: Sequence construction of Polar codes for control channel (R1-1711218)—Jun. 27-30, 2017.

3GPP TSG-RAN WG1 #90; Prague, Czech Republic; Source: Qualcomm Incorporated; Title: Sequence construction of Polar Codes for control channel (R1-1713468)—Aug. 21-25, 2017.

PCT International Search Report for International application No. PCT/IB2018/055351—dated Oct. 22, 2018.

PCT Written Opinion of the International Searching Authority for International application No. PCT/IB2018/055351—dated Oct. 22, 2018.

* cited by examiner

Example of polar code structure with N = 8

*Polar code encoder with N = 8*

ENHANCED INFORMATION SEQUENCES FOR POLAR CODES

PRIORITY

This nonprovisional application is a U.S. National Stage Filing under 35 U.S.C. § 371 of International Patent Application Serial No. PCT/IB2018/55351 filed Jul. 18, 2018 and entitled "ENHANCED INFORMATION SEQUENCES FOR POLAR CODES" which claims priority to U.S. Provisional Patent Application No. 62/534,562 filed Jul. 19, 2017 both of which are hereby incorporated by reference in their entirety.

TECHNICAL FIELD

Particular embodiments are directed to wireless communications and, more particularly, to enhanced information sequences for polar codes.

INTRODUCTION

Polar codes, proposed by E Arikan, "Channel Polarization: A Method for Constructing Capacity-Achieving Codes for Symmetric Binary-Input Memoryless Channels," IEEE Transactions on Information Theory, vol. 55, pp. 3051-3073, July 2009, are a class of constructive coding schemes that achieve the symmetric capacity of the binary-input discrete memoryless channels under a low-complexity Successive Cancellation (SC) decoder. The finite-length performance of polar codes under SC, however, is not competitive compared to other modem channel coding schemes such as Low-Density Parity-Check (LDPC) codes and Turbo codes. An SC List (SCL) decoder is proposed in I. Tal and A. Vardy, "List Decoding of polar codes," Proceedings of IEEE Symp. Iuf. Theory. pp. 1-5, 2011, that approaches the performance of optimal Maximum-Likelihood (ML) decoder. By concatenating a simple Cyclic Redundancy Check (CRC) coding, the performance of a concatenated polar code is competitive with that of well-optimized LDPC and Turbo codes. As a result, polar codes are being considered as a candidate for future Fifth Generation (5G) wireless communication systems.

Polar coding transforms a pair of identical binary-input channels into two distinct channels of different qualities, one better and one worse than the original binary-input channel. Repeating such a pair-wise polarizing operation on a set of $N=2^n$ independent uses of a binary-input channel results in a set of $2^n$ "bit-channels" of varying qualities. Some of the bit channels are nearly perfect (i.e., error free) while the rest of them are nearly useless (i.e., totally noisy). Polar coding uses the nearly perfect channel to transmit data to the receiver and sets the input to the useless channels to have fixed or frozen values (e.g., 0) known to the receiver. For this reason, the input bits to the nearly useless and the nearly perfect channel are commonly referred to as frozen bits and non-frozen (or information) bits, respectively. Only the non-frozen bits are used to carry data in a polar code. Loading the data into the proper information bit locations has direct impact on the performance of a polar code. The set of information bit locations is commonly referred to as an information set. An illustration of the structure of a length-8 polar code is illustrated in FIG. 1.

In general, the set of information bit locations varies with the number of channel uses, or equivalently the code length, N, as well as the number of data bits, or equivalently the number of information bit locations. K. However, with the commonly used Additive White Gaussian Noise (AWGN) channel model, for any code length N, if $K_1<K_2$, then the information set $A_1$ with $K_1$ information bit locations is always a (proper) subset of the information set $A_2$ with $K_2$ information bit locations. As a result, with an AWGN channel, for any given code length N, the information sets for all possible number of information bit locations, K, may be specified by a ranking sequence $S_N$, of bit location indices of length N so that the first K indices in $S_N$ is the set of information bit locations if there are K data bits, for any $K\in(1, 2, \ldots, N)$. Such a ranking sequence $S_N$ is referred to as the information sequence, from which the locations of bit-channels for carrying any number of data bits K can be derived.

FIG. 2 illustrates the labeling of the intermediate information bits $s_{l,i}$, where $l\in\{0, 1, \ldots, n\}$ and $i\in\{0, 1, \ldots, N-1\}$ during polar encoding with N=8. The intermediate information bits are related by the following equation:

$$s_{l+1,i} = s_{l,i} \oplus s_{l,i+2^l}, \text{ for}$$

$$i \in \left\{ j \in \{0, 1, \ldots, N-1\} : \operatorname{mod}\left( \left\lfloor \frac{j}{2^l} \right\rfloor, 2 \right) = 0 \right\} \text{ and}$$

$$l \in \{0, 1, \ldots, n-1\}, \text{ and}$$

$$s_{l+1,i+2^l} = s_{l,i+2^l}, \text{ for}$$

$$i \in \left\{ j \in \{0, 1, \ldots, N-1\} : \operatorname{mod}\left( \left\lfloor \frac{j}{2^l} \right\rfloor, 2 \right) = 0 \right\} \text{ and}$$

$$l \in \{0, 1, \ldots, n-1\}$$

where $s_{0,i}\equiv u_i$ are the information bits and $s_{n,i}\equiv x_i$ are the code bits for $i\in\{0, 1, \ldots, N-1\}$.

SUMMARY

A main design issue of polar coding is to identify the information sequence from which the locations of bit-channels for carrying K data bits can be obtained for a given code length N. In Huawei, HiSilicon, "Polar code design and rate matching," 3GPP contribution R1-167209, September 2016, it is proposed that such an information sequence can be obtained by assigning a weight for each bit channel indexed by j based on the following polarization weight function:

$$W(j) = \sum_{i=0}^{n-1} b_i \beta^i$$

where $$\beta = 2^{\frac{1}{4}} \text{ and } j = \sum_{i=0}^{n-1} b_i 2^i$$

is the binary expansion of the bit-channel index j. The information sequence is obtained simply by sorting values of W(i) for $i\in\{0, 1, 2, \ldots, 2^n\}$. This information sequence is referred to as the Polarization Weight (PW) sequence.

One problem with the PW sequence is that it imposes an artificial relationship among the relative reliabilities of different bit channels as dictated by the PW function. Moreover, the value of the weight β is derived assuming an SC decoder instead of an SCL decoder, which is more commonly used in practice.

In this disclosure, information sequences that are numerically optimized for some specific code length N are presented. The optimization accounts for the performance of SCL decoders of different list sizes at different operating levels of Block Error Rate (BLER) (e.g., BLER==1% or 0.1%).

According to some embodiments, a method of operation of a transmit node in a wireless communication system comprises performing polar encoding of a set of K information bits to thereby generate a set of polar-encoded information bits. The K information bits are mapped to the first K bit locations in an information sequence SN. The information sequence SN is a ranked sequence of N information bit locations among a plurality of input bits for the polar encoding where N is equivalent to a code length. A size of the information sequence SN is greater than or equal to K. The information sequence SN is optimized for the specific value of the code length (N). The method may further comprise transmitting the set of polar-encoded information bits.

According to some embodiments, a transmit node comprises a polar encoder operable to perform polar encoding of a set of K information bits to thereby generate a set of polar-encoded information bits. The K information bits are mapped to the first K bit locations in an information sequence SN. The information sequence SN is a ranked sequence of N information bit locations among a plurality of input bits for the polar encoding where N is equivalent to a code length. A size of the information sequence SN is greater than or equal to K The information sequence SN is optimized for the specific value of the code length (N). The transmit node may further comprises a transmitter operable to transmit the set of polar-encoded information bits.

According to some embodiments, a method of operation of a receive node in a wireless communication system comprises performing polar decoding of a set of polar encoded information bits to thereby generate a set of K information bits. The K information bits are mapped to the first K bit locations in an information sequence SN. The information sequence SN is a ranked sequence of N information bit locations among a plurality of input bits for the polar encoding where N is equivalent to a code length. A size of the information sequence SN is greater than or equal to K. The information sequence SN is optimized for the specific value of the code length (N). The method may further comprise receiving the set of polar-encoded information bits.

According to some embodiments, a receive node comprises a polar decoder operable to perform polar decoding of a set of polar encoded information bits to thereby generate a set of K information bits. The K information bits are mapped to the first K bit locations in an information sequence SN. The information sequence SN is a ranked sequence of N information bit locations among a plurality of input bits for the polar encoding where N is equivalent to a code length. A size of the information sequence SN is greater than or equal to K. The information sequence SN is optimized for the specific value of the code length (N). The receive node may further comprise a receiver operable to receive the set of polar-encoded information bits.

Also disclosed is a computer program product. The computer program product comprises instructions stored on non-transient computer-readable media which, when executed by a processor, perform the step of performing polar encoding of a set of K information bits to thereby generate a set of polar-encoded information bits. The K information bits are mapped to the first K bit locations in an information sequence SN. The information sequence SN is a ranked sequence of N information bit locations among a plurality of input bits for the polar encoding where N is equivalent to a code length. A size of the information sequence SN is greater than or equal to K. The information sequence SN is optimized for the specific value of the code length (N).

Another computer program product comprises instructions stored on non-transient computer-readable media which, when executed by a processor, perform the step of performing polar decoding of a set of polar encoded information bits to thereby generate a set of K information bits. The K information hits are mapped to the first K bit locations in an information sequence SN. The information sequence SN is a ranked sequence of N information bit locations among a plurality of input bits for the polar encoding where N is equivalent to a code length. A size of the information sequence SN is greater than or equal to K. The information sequence SN is optimized for the specific value of the code length (N).

A key advantage of the proposed information sequences is that they generally yield better performance for the code lengths that they are designed for compared to the PW sequence because they are individually optimized.

In general, the disclosed embodiments include sets of information sequences that are individually optimized for a set of specific code block lengths.

BRIEF DESCRIPTION OF THE DRAWINGS

The accompanying drawing figures, incorporated in and forming a part of this specification, illustrate several aspects of the disclosure, and together with the description form a more complete understanding of the embodiments and their features and advantages.

DETAILED DESCRIPTION

Figure 1:
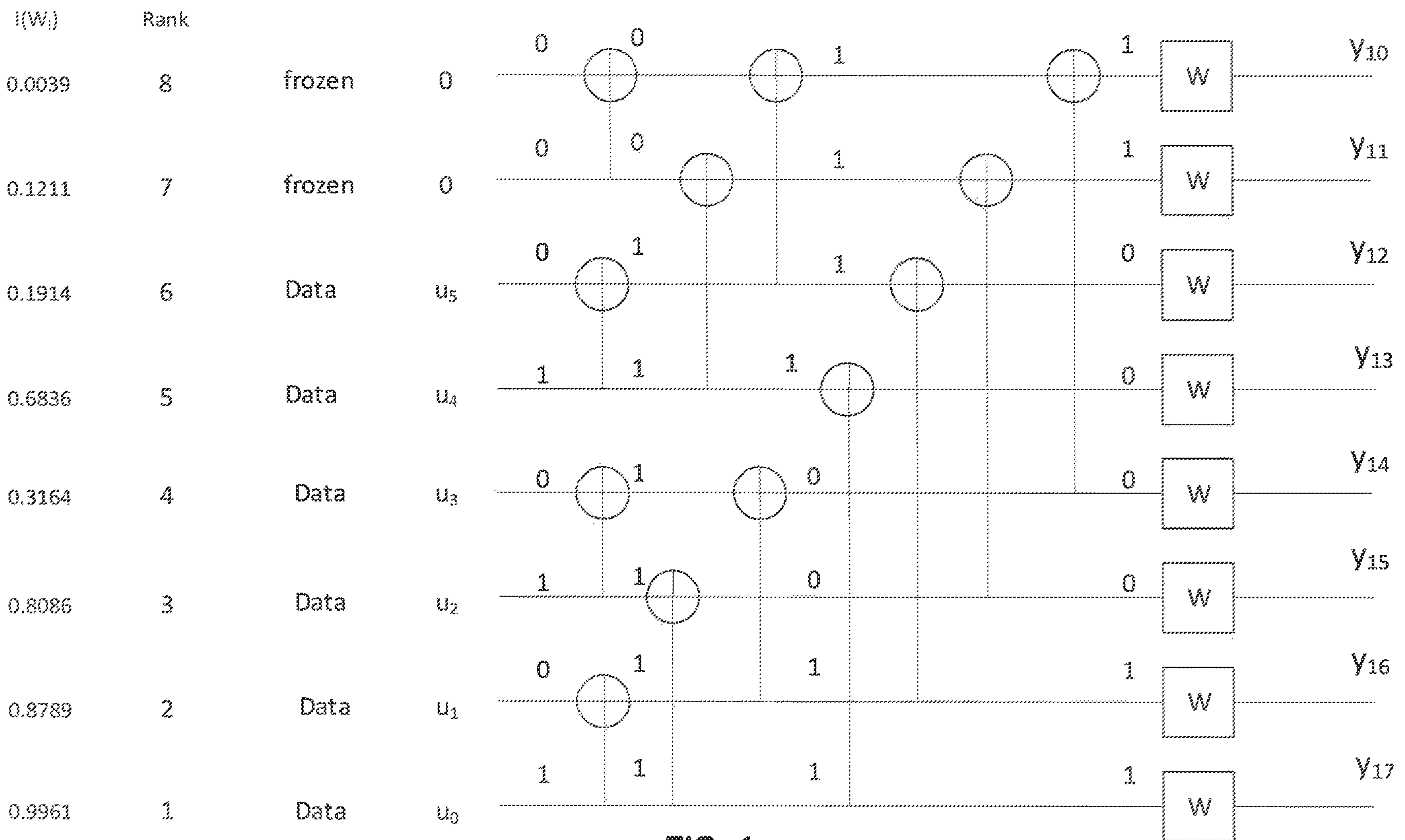
FIG. 1 illustrates an example of a polar code structure with N=8.
Figure 2:
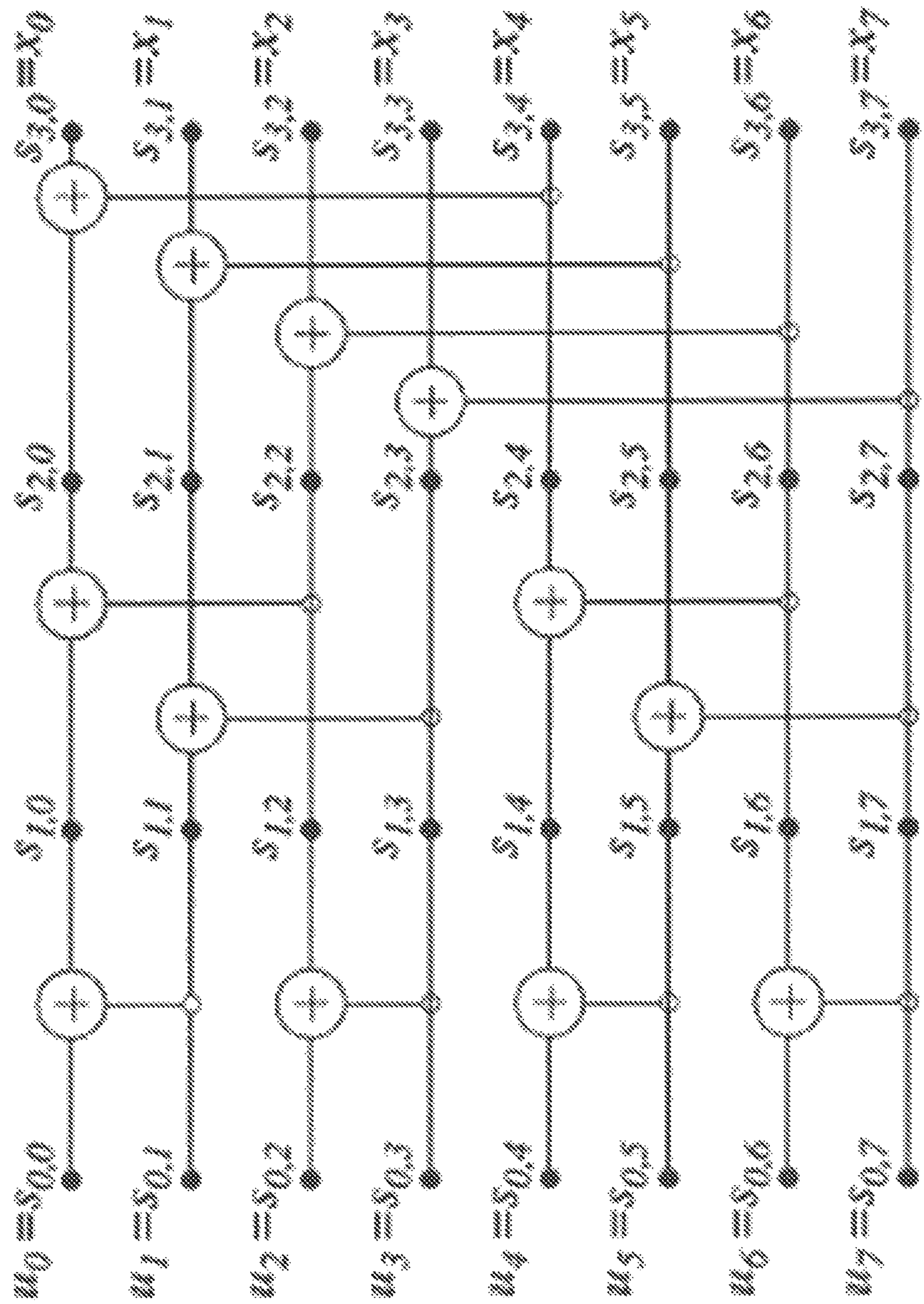
FIG. 2 illustrates labelling of intermediate bits in a polar code encoder with N=8.

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure.

Radio Node: As used herein, a "radio node" is either a radio access node or a wireless device.

Radio Access Node: As used herein, a "radio access node" or "radio network node" is any node in a radio access network of a cellular communications network that operates to wirelessly transmit and/or receive signals. Some examples of a radio access node include, but are not limited to, a base station (e.g., a New Radio (NR) base station (gNB) in a Third Generation Partnership Project (3GPP) 5G NR network or an enhanced or evolved Node B (eNB) in a 3GPP Long Term Evolution (LTE) network), a high-power or macro base station, a low-power base station (e.g., a macro base station, a pico base station, a home eNB, or the like), and a relay node.

Core Network Node: As used herein, a "core network node" is any type of node in a core network. Some examples of a core network node include, e.g., a Mobility Management Entity (MME), a Packet Data Network Gateway (P-GW), a Service Capability Exposure Function (SCEF), or the like.

Wireless Device: As used herein, a "wireless device" is any type of device that has access to (i.e., is served by) a cellular communications network by wirelessly transmitting and/or receiving signals to a radio access node(s). Some examples of a wireless device include, but are not limited to, a User Equipment device (UE) in a 3GPP network and a Machine Type Communication (MTC) device.

Network Node: As used herein, a "network node" is any node that is either part of the radio access network or the core network of a cellular communications network/system.

Note that the description given herein focuses on a 3GPP cellular communications system and, as such, 3GPP terminology or terminology similar to 3GPP terminology is oftentimes used. However, the concepts disclosed herein are not limited to a 3GPP system.

Note that, in the description herein, reference may be made to the term "cell;" however, particularly with respect to 5G NR concepts, beams may be used instead of cells and, as such, it is important to note that the concepts described herein are equally applicable to both cells and beams.

Systems and methods are disclosed herein relating to polar codes and the use thereof in a wireless communications system.

In this disclosure, information sequences that are numerically optimized for some specific code length N are presented. The optimization is done in such a way that accounts for the performance of SCL decoders of different list sizes at different operating levels of BLER (e.g., BLER=1% or 0.1%).

A key advantage of the proposed information sequences is that they generally yield better performance for the code lengths that they are designed for compared to the PW sequence because they are individually optimized.

In general, the disclosed embodiments include sets of information sequences that are individually optimized for a set of specific code block lengths.

Listed below are length-64 and length-128 sequences that perform well with a SCL decoder and a SC decoder in practice. Note that it should be clear to those skilled in the art that a subsequence (or part) of each of these sequences may be extracted and used in a SCL decoder to perform polar decoding while discarding the rest of the sequence.

Code Sequence for Length N=64: Listed below is a length-64 sequence that performs well with an SCL decoder and an SC decoder in practice.

$S_{64}$=[63 62 61 59 55 47 60 31 58 57 54 53 46 51 45 30 43 56 29 39 27 52 50 23 44 49 15 42 28 41 38 26 37 25 22 35 21 14 48 19 13 40 11 36 7 24 34 2033 18 12 17 10 9 6 5 33216 8 4 2 1 0]

Code Sequence for Length N=128: Listed below are length-128 sequences that perform well with an SCL decoder and an SC decoder in practice.

$s_{128}$=[127 126 125 123 119 111 124 95 122 121 118 63 117 110 115 109 94 107 93120103 91 62116 61 87114 108 59 113 79 55 106 92 105 47102 90 31 101 89 99 60 86 85 58 112 78 57 83 54 77 104 53 75 46 100 51 88 45 71 98 30 43 84 97 29 56 82 39 76 27 81 52 74 23 50 73 44 15 70 49 42 69 28 41 96 67 38 26 37 25 80 22 35 21 14 19 72 13 48 68 11 40 66 7 36 65 24 34 20 33 18 12 17 10 9 6 64 5 3 32 16 8 4 2 1 0]; (This is unconstrained length-128 sequence without nesting in it another length-36 sequence)

$S_{128}$=[127 126 125 123 119 111 124 95 122 121 118 63 117 110 115 109 94 107 93 120 103 91 62 116 61 87114 108 59 113 79 55 106 92 105 47 102 90 60 101 89 99 31 86 85 58 112 78 57 83 54 77 104 53 75 46 100 51 88 45 71 98 43 30 84 97 29 39 82 56 76 27 81 52 74 23 50 73 44 49 70 15 42 69 28 41 96 67 38 26 37 25 80 22 35 21 14 48 72 19 13 68 11 40 66 36 7 65 24 34 20 33 18 12 17 10 9 6 64 5 3 32 16 8 4 2 1 0]; (This is length-128 sequence of VI with another length-36 DCM #1 sequence nested in it)

$S_{122}$=[127 126 125 123 119 111 124 95 122 121 118 63 117 110 115 109 94 107 93 120 103 91 62 116 61 87 114 108 59 113 79 55 106 92 105 47 102 90 60 101 89 99 31 86 85 58 112 78 57 83 54 77 104 53 75 46 100 51 88 45 71 98 30 43 84 97 56 29 82 39 76 27 81 52 74 50 23 73 44 49 70 15 42 69 28 41 96 67 38 26 37 25 80 22 35 21 14 48 72 19 13 68 40 11 66 36 7 65 24 34 20 33 18 12 17 10 9 6 64 5 3 32 16 8 4 2 1 0]; (This is length-128 sequence of VI with $S_{64}$ above nested in it.)

$S_{129}$=[127 126 125 123 119 111 124 95 122 121 118 63 117 110 115 109 94 107 93 120103 91 62 116 61 87 114 108 59 113 79 55 106 92 105 47102 90 60 101 89 99 31 86 85 58 112 78 57 83 54 77 104 53 75 46100 51 88 45 71 98 43 30 84 97 29 39 82 27 76 56 81 52 74 23 50 73 15 44 70 49 42 69 41 28 96 67 38 26 37 25 80 22 35 21 14 19 72 13 11 68 48 40 66 7 36 65 24 20 34 33 18 12 10 17 6 9 64 5 3 32 16 8 4 2 1 0]; (This is length-128 sequence of VI with Intel's seq #2 of length 64 above nested in it.)

$S_{128}$=[127 126 125 123 119 111 124 95 122 121 118 63 117 110 115 109 94 107 93 120 103 91 62 116 61 114 87 108 59 113 79 106 55 92 105 102 47 90101 31 89 60 99 86 85 58 112 78 57 83 54 77 104 53 75 46 100 51 88 45 71 98 30 43 84 97 29 56 82 39 76 27 81 52 74 23 50 73 44 15 70 49 42 69 28 41 96 67 38 26 37 25 80 22 35 21 14 19 72 13 48 68 11 40 66 7 36 65 24 34 20 33 18 12 17 10 9 6 64 5 3 32 16 8 4 2 1 0]; (This is unconstrained length-128 sequences modified from VI on 26-41th places.)

$S_{128}$=[127 126 125 123 119 111 124 95 122 121 118 63 117 110115 109 94 107 93 120 103 91 62 116 61 114 87 108 59 113 79 106 55 92 105 102 47 90 101 60 89 31 99 86 85 58 112 78 57 83 54 77 104 53 75 46100 51 88 45 71 98 43 30 84 97 29 39 82 56 76 27 81 52 74 23 50 73 44 49 70 15 42 69 28 41 96 67 38 26 37 25 80 22 35 21 14 48 72 19 13 68 11 40 66 36 7 65 24 34 20 33 18 12 17 10 9 6 64 5 3 32 16 8 4 2 1 0]; (This is length-128 sequence of V3 with another length-36 DCM #1 sequence nested in it)

$S_{128}$=[127 126 125 123 119 111 124 95 122 121 118 63 117 110 115 109 94 107 93 120 103 91 62 116 61 114 87 108 59 113 79 106 55 92 105 102 47 90 101 60 89 31 99 86 85 58 112 78 57 83 54 77 104 53 75 46 100 51 88 45 71 98 30 43 84 97 56 29 82 39 76 27 81 52 74 50 23 73 44 49 70 15 42 69 28 41 96 67 38 26 37 25 80 22 35 21 14 48 72 19 13

68 40 11 66 36 7 65 24 34 20 33 18 12 17 10 9 6 64 5 3 32 16 8 4 2 1 0]: (This is length-128 sequence of V3 with S_64 above nested in it.)

$S_{128}$=[127 126 125 123 119 111 124 95 122 121 118 63 117 110 115 109 94 107 93 120 103 91 62 116 61 114 87108 59 113 79 106 55 92 105 102 47 90 101 60 89 31 99 86 85 58 112 78 57 83 54 77 104 53 75 46100 51 88 45 71 98 43 30 84 97 29 39 82 27 76 56 81 52 74 23 50 73 15 44 70 49 42 69 41 28 96 67 38 26 37 25 80 22 35 21 14 19 72 13 11 68 48 40 66 7 36 65 24 20 34 33 18 12 10 17 6 9 64 5 3 32 16 8 4 2 1 0]; (This is length-128 sequence of V3 with Intel's seq #2 of length 64 above nested in it.).

Figure 3:
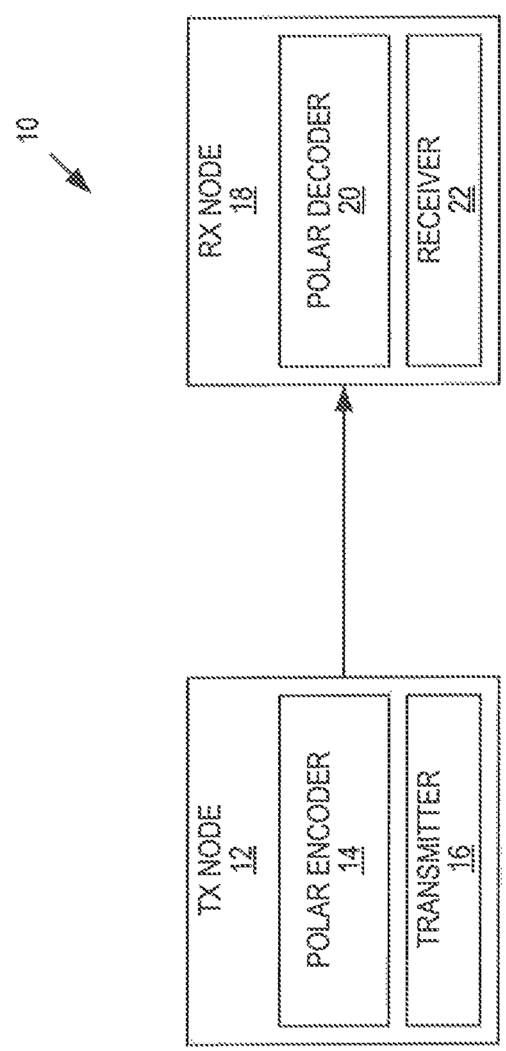
FIG. 3 illustrates one example of a system in which embodiments of the present disclosure may be Implemented

In this regard. FIG. 3 illustrates a wireless communications system 10 including a transmit (TX) node 12 that includes a polar encoder 14 (i.e., a polar code encoder) and a transmitter 16, and a receive (RX) node 18 that includes a polar decoder 20 (i.e., a polar code decoder) and a receiver 22. The polar encoder 14 may be implemented in hardware or a combination of hardware and software (e.g., software stored on memory and executed by a processor(s)). The transmitter 16 includes various hardware components such as, e.g., Digital-to-Analog Converter(s) (DAC(s)), filter(s), mixer(s), amplifier(s), and/or the like. Likewise, the polar decoder 20 may be implemented in hardware or a combination of hardware and software (e.g., software stored on memory and executed by a processor(s)). The receiver 22 includes various hardware components such as, e.g., an Analog-to-Digital Converter(s) (ADC(s)), filter(s), mixer(s), amplifier(s), and/or the like. The wireless communications system 10 may be any type of wireless communications system such as, but not limited to, a cellular communications network in which the transmit node 12 is, e.g., a radio access node (e.g., a base station) and the receive node 18 is a wireless device or terminal (e.g., a UE), or vice versa.

Figure 4A:
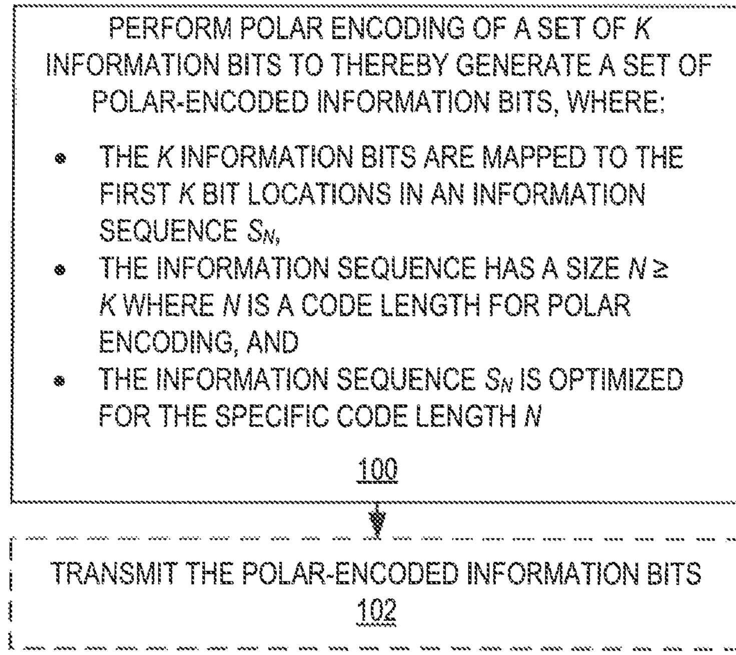
FIG. 4A is a flow chart that illustrates the operation of a transmit node in accordance with some embodiments of the present disclosure.

FIG. 4A is a flow chart that illustrates the operation of the transmit node 12 in accordance with some embodiments of the present disclosure. Optional steps are represented by a dashed box. As illustrated, the transmit node 12, and in particular the polar encoder 14, performs polar encoding of a set of K information bits to thereby generate a set of polar-encoded information bits (step 100). For polar encoding, there is a set of input bit locations for the polar encoder 14 consisting of N information bit (i.e., not frozen bit) locations and one or more non-information (i.e., frozen) bit locations, where N is the code length and N≥K. The N information bit locations are referred to as an information set. An information sequence SN (i.e., a ranking sequence of the information bit locations) is optimized for the specific code length N. The K information bits are mapped to the first K bit locations in the information sequence SN.

In some embodiments, N=64 and the information sequence SN is:

$S_{64}$=[63 62 61 59 55 47 60 31 58 57 54 53 46 51 45 30 43 56 29 39 27 52 50 23 44 49 15 42 28 41 38 26 37 25 22 35 21 14 48 19 13 40 11 36 7 24 34 20 33 18 12 17 10 9 6 5 3 32 16 8 4 2 1 0].

In some other embodiments, N=128 and the information sequences $S_N$ are:

$S_{128}$=[127 126 125 123 119 111 124 95 122 121 118 63 117 110 115 109 94 107 93 120 103 91 62 116 61 87 114 108 59 113 79 55 106 92 105 47 102 90 31101 89 99 60 86 85 58 112 78 57 83 54 77 104 53 75 46 100 51 88 45 71 98 30 43 84 97 29 56 82 39 76 27 81 52 74 23 50 73 44 15 70 49 42 69 28 41 96 67 38 26 37 25 80 22 35 21 14 19 72 13 48 68 11 40 66 7 36 65 24 34 20 33 18 12 17 10 9 664 5 3 32 16 8 4 2 1 0].

$S_{128}$=[127 126 125 123 119 111 124 95 122 121 118 63 117 110 115 109 94 107 93 120 103 91 62 116 61 87 114 108 59 113 79 55 106 92 105 47 102 90 60 101 89 99 31 86 85 58 112 78 57 83 54 77 104 53 75 46100 51 88 45 71 98 43 30 84 97 29 39 82 56 76 27 81 52 74 23 50 73 44 49 70 15 42 69 28 41 96 67 38 26 37 25 80 22 35 21 14 48 72 19 13 68 11 40 66 36 7 65 24 34 20 33 18 12 17 10 9 6 64 5 3 32 16 8 4 2 1 0]:

$S_{128}$=[127 126 125 123 119 111 124 95 122 121 118 63 117 110 115 109 94 107 93 120 103 91 62 116 61 87 114 108 59 113 79 55 106 92 105 47 102 90 60 101 89 99 31 86 85 58 112 78 57 83 54 77 104 53 75 46100 51 88 45 71 98 30 43 84 97 56 29 82 39 76 27 81 52 74 50 23 73 44 49 70 15 42 69 28 41 96 67 38 26 37 25 80 22 35 21 14 48 72 19 13 68 40 11 66 36 7 65 24 34 20 33 18 12 17 10 9 6 64 5 3 32 16 8 4 2 1 0]:

$S_{128}$=[127 126 125 123 119 111 124 95 122 121 118 63 117 110 115 109 94 107 93 120 103 91 62 116 61 87 114 108 59 113 79 55 106 92 105 47 102 90 60 101 89 99 31 86 85 58 112 78 57 83 54 77 104 53 75 46 100 51 88 45 71 98 43 30 84 97 29 39 82 27 76 56 81 52 74 23 50 73 15 44 70 49 42 69 41 28 96 67 38 26 37 25 80 22 35 21 14 19 72 13 11 68 48 40 66 7 36 65 24 20 34 33 18 12 10 17 6 9 64 5 3 32 16 8 4 2 1 0]:

$S_{128}$=[127 126 125 123 119 111 124 95 122 121 118 63 117 110 115 109 94 107 93 120 103 91 62116 61 114 87 108 59113 79 106 55 92 105 102 47 90 101 31 89 60 99 86 85 58 112 78 57 83 54 77 104 53 75 46 100 51 88 45 71 98 30 43 84 97 29 56 82 39 76 27 81 52 74 23 50 73 44 15 70 49 42 69 28 41 96 67 38 26 37 25 80 22 35 21 14 19 72 13 48 68 11 40 66 7 36 65 24 34 20 33 18 12 17 10 9 6 64 5 3 32 16 8 4 2 1 0];

$S_{128}$=[127 126 125 123 119 111 124 95 122 121 118 63 117 110 115 109 94 107 93 120 103 91 62 116 61 114 87 108 59 113 79 106 55 92 105 102 47 90101 60 89 31 99 86 85 58 112 78 57 83 54 77 104 53 75 46 100 51 88 45 71 98 43 30 84 97 29 39 82 56 76 27 81 52 74 23 50 73 44 49 70 15 42 69 28 41 96 67 38 26 37 25 80 22 35 21 14 48 72 19 13 68 11 40 66 36 7 65 24 34 20 33 18 12 17 10 9 6 64 5 3 32 16 8 4 2 1 0].

$S_{128}$=[127 126 125 123 119 111 124 95 122 121 118 63 117 110 115 109 94 107 93 120 103 91 62 116 61 114 87108 59 113 79 106 55 92 105 102 47 90 101 60 89 31 99 86 85 58 112 78 57 83 54 77104 53 75 46100 51 88 45 71 98 30 43 84 97 56 29 82 39 76 27 81 52 74 50 23 73 44 49 70 15 42 69 28 41 96 67 38 26 37 25 80 22 35 21 14 48 72 19 13 68 40 11 66 36 7 65 24 34 20 33 18 12 17 10 9 6 64 5 3 32 16 8 4 2 1 0]

$S_{128}$=[127 126 125 123 119 111 124 95 122 121 118 63 117 110 115 109 94 107 93 120 103 91 62 116 61114 87108 59113 79 106 55 92 105 102 47 90 101 60 89 31 99 86 85 58 112 78 57 83 54 77 104 53 75 46 100 51 88 45 71 98 43 30 84 97 29 39 82 27 76 56 81 52 74 23 50 73 15 44 70 49 42 69 41 28 96 67 38 26 37 25 80 22 35 21 14 19 72 13 11 68 48 40 66 7 36 65 24 20 34 33 18 12 10 17 6 9 64 5 3 32 16 8 4 2 1 0];

Optionally, the transmit node 12, and more specifically the transmitter 16, transmits the polar-encoded information bits (step 102). Notably, other optional steps (e.g., rate-matching) may be performed after polar encoding and prior to transmission.

Figure 4B:
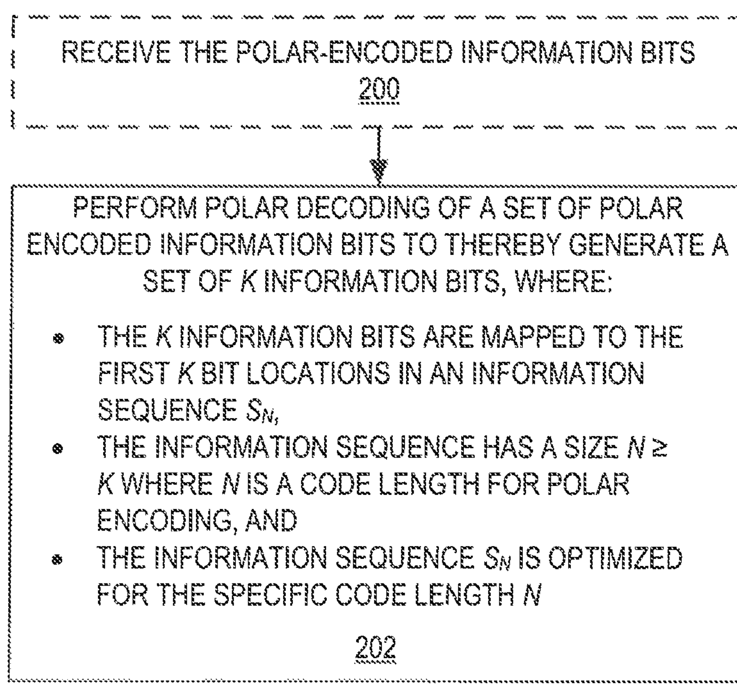
FIG. 4B is a flow chart that illustrates the operation of a receive node in accordance with some embodiments of the present disclosure.

FIG. 4B is a flow chart that illustrates the operation of the receive node 18 in accordance with some embodiments of the present disclosure. Optional steps are represented by a dashed box. As illustrated, the receive node 18, and in particular the polar decoder 20, performs polar decoding of a set of polar encoded information bits to thereby generate a set of K information bits (step 202). The polar encoded bits may have been generated according to step 100 described with respect to FIG. 4A.

Optionally, the receive node 18, and more specifically the receiver 22, receives the polar-encoded information bits (step 200). Notably, other optional steps may be performed after receiving and before polar decoding.

Figure 5:
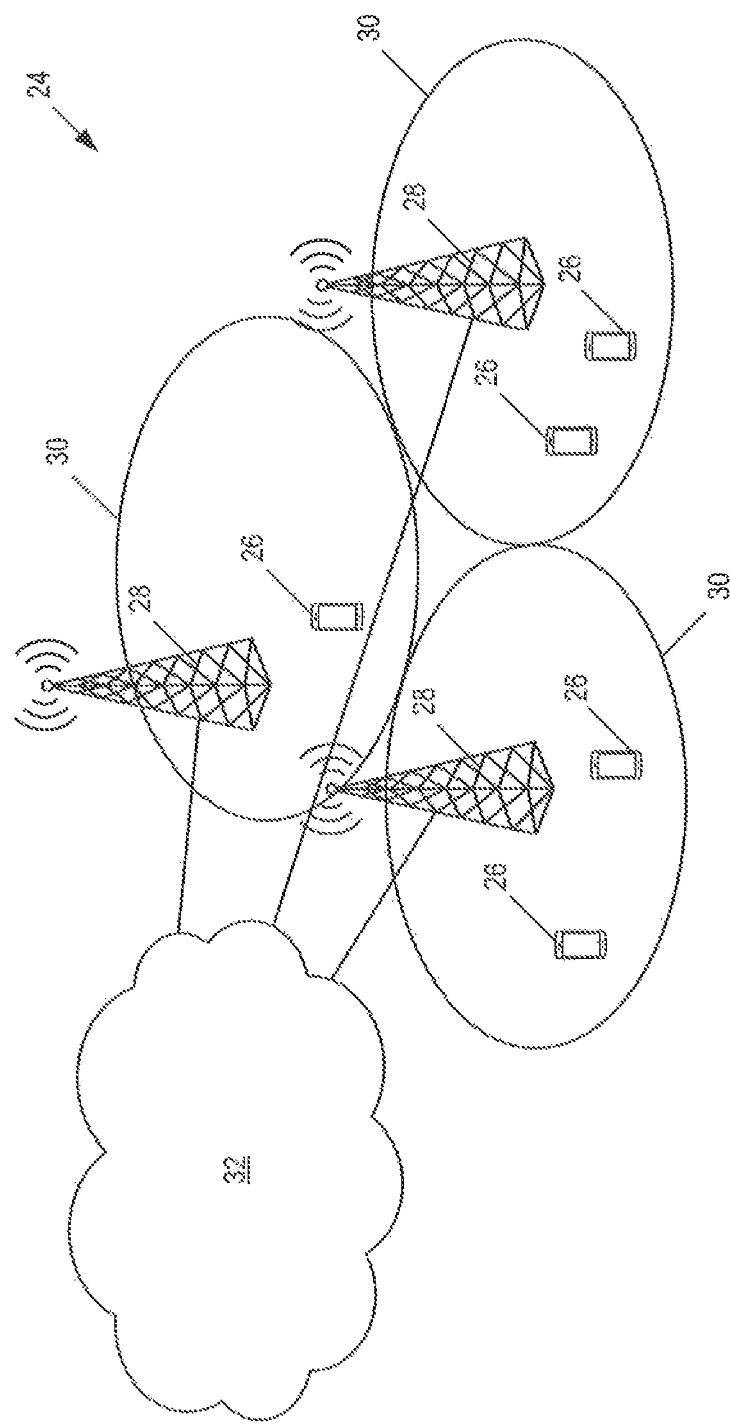
FIG. 5 illustrates one example of a wireless communication system in which embodiments of the present disclosure may be implemented.

FIG. 5 illustrates one example of a wireless communication system 24 in which embodiments of the present disclosure may be implemented. The wireless communication system 24 is preferably a 3GPP 5G NR system, but is not limited thereto. As illustrated, the wireless communication system 24 includes a number of wireless communication devices 26, 20 which are also referred to herein as UEs. In addition, the wireless communication system 24 includes a radio access network that includes a number of radio access nodes 28 (e.g., gNBs) serving corresponding coverage areas or cells 30. The radio access nodes 28 are connected to a core network 32, which includes a number of core network nodes, as will be appreciated by one of skill in the art.

As an example, the radio access node 28 and/or the wireless communication device 26 may operate as the transmit node 12 described above.

Figure 6:
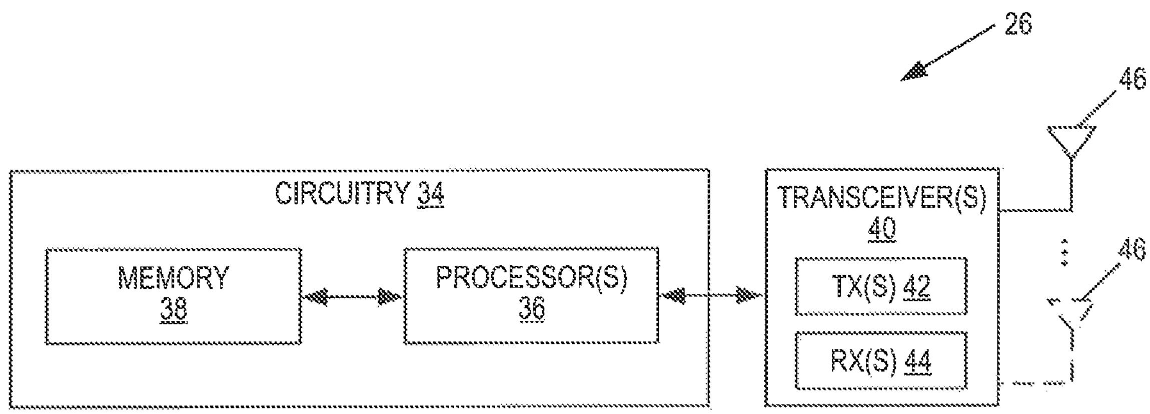
FIGS. 6 and 7 illustrate example embodiments of a wireless communication device.

FIG. 6 is a schematic block diagram of the wireless communication device 26, or UE, according to some embodiments of the present disclosure. As illustrated, the wireless communication device 26 includes circuitry 34 comprising one or more processors 36 (e.g., Central Processing Units (CPUs). Application Specific Integrated Circuits (ASICs). Field Programmable Gate Arrays (FPGAs), Digital Signal Processors (DSPs), and/or the like) and memory 38. The wireless communication device 26 also includes one or more transceivers 40 each including one or more transmitters 42 and one or more receivers 44 coupled to one or more antennas 46. In some embodiments, the functionality of the wireless communication device 26 described herein may be implemented in hardware (e.g., via hardware within the circuitry 34 and/or within the processor(s) 36) or be implemented in a combination of hardware and software (e.g., fully or partially implemented in software that is, e.g., stored in the memory 38 and executed by the processor(s) 36).

In some embodiments, a computer program including instructions which, when executed by the at least one processor 36, causes the at least one processor 36 to carry out at least some of the functionality of the wireless communication device 26 according to any of the embodiments described herein is provided. In some embodiments, a carrier containing the aforementioned computer program product is provided. The carrier is one of an electronic signal, an optical signal, a radio signal, or a computer readable storage medium (e.g., a non-transitory computer readable medium such as memory).

Figure 7:
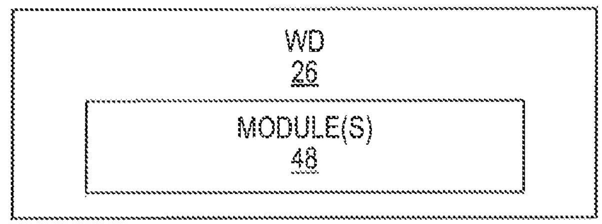

FIG. 7 is a schematic block diagram of the wireless communication device 26, or UE, according to some other embodiments of the present disclosure. The wireless communication device 26 includes one or more modules 48, each of which is implemented in software. The module(s) 48 provide the functionality of the wireless communication device 26, or more specifically the transmit node 12, described herein (e.g., as described with respect to FIGS. 3 and 4).

Figure 8:
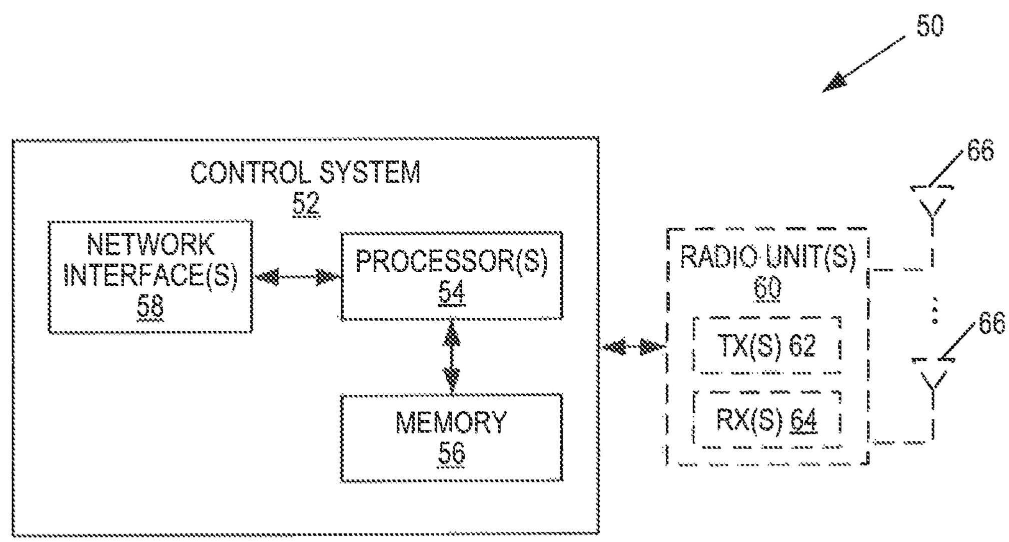
FIGS. 8 through 10 illustrate example embodiments of a network node.

FIG. 8 is a schematic block diagram of a network node 50 (e.g., a radio access node 28 such as, for example, a gNB) according to some embodiments of the present disclosure. As illustrated, the network node 50 includes a control system 52 that includes circuitry comprising one or more processors 54 (e.g., CPUs. ASICs, DSPs, FPGAs, and/or the like) and memory 56. The control system 52 also includes a network interface 58. In embodiments in which the network node 50 is a radio access node 28, the network node 50 also includes one or more radio units 60 that each include one or more transmitters 62 and one or more receivers 64 coupled to one or more antennas 66. In some embodiments, the functionality of the network node 50 (specifically the functionality of the radio access node 28 or transmit node 12) described above may be fully or partially implemented in software that is, e.g., stored in the memory 56 and executed by the processor(s) 54.

Figure 9:
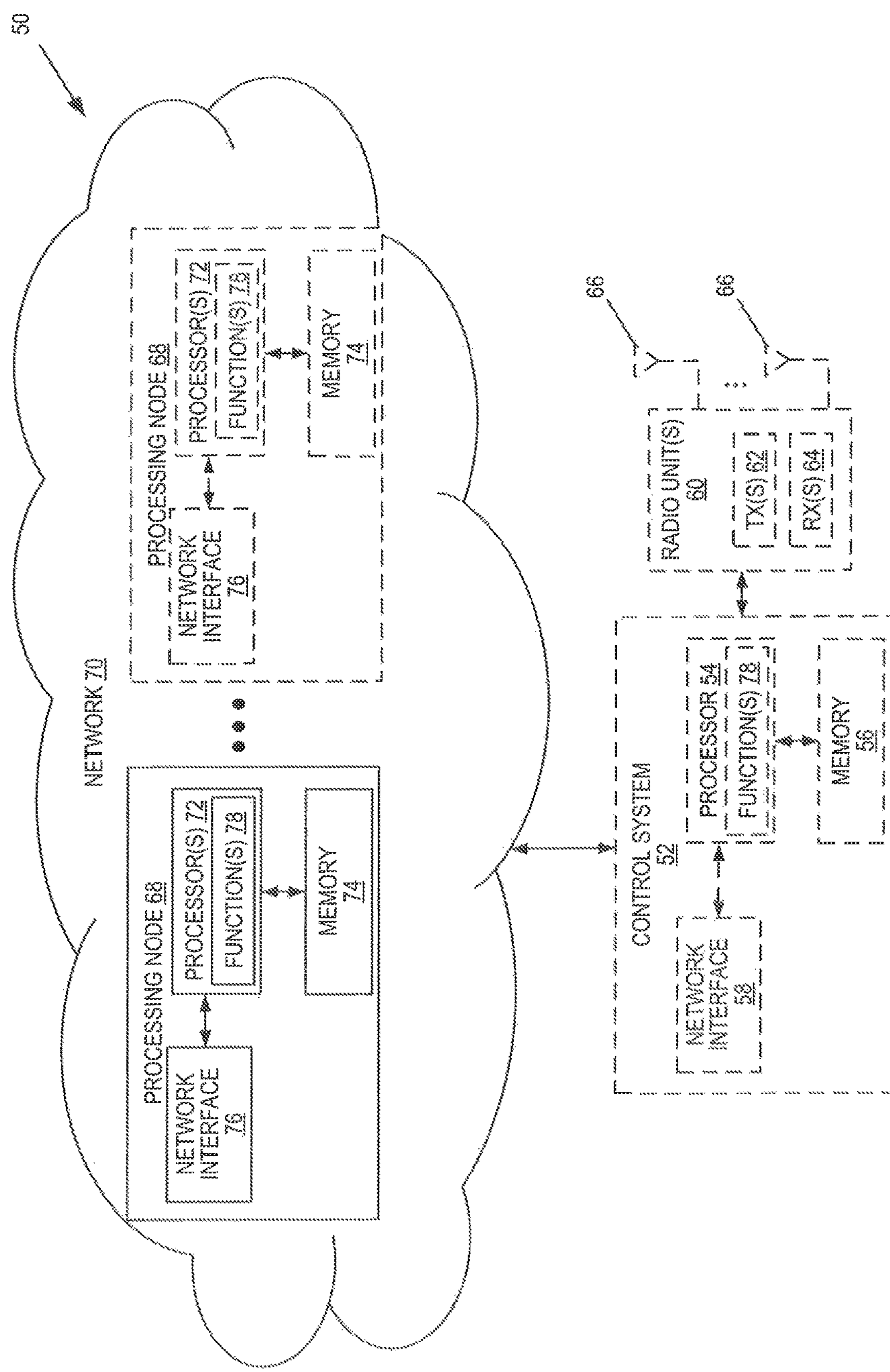

FIG. 9 is a schematic block diagram that illustrates a virtualized embodiment of the network node 50 (e.g., the radio access node 28) according to some embodiments of the present disclosure. As used herein, a "virtualized" network node 50 is a network node 50 in which at least a portion of the functionality of the network node 50 is implemented as a virtual component (e.g., via a virtual machine(s) executing on a physical processing node(s) in a network(s)). As illustrated, the network node 50 optionally includes the control system 52, as described with respect to FIG. 8. In addition, if the network node 50 is the radio access node 28, the network node 50 also includes the one or more radio units 60, as described with respect to FIG. 8. The control system 52 (if present) is connected to one or more processing nodes 68 coupled to or included as part of a network(s) 70 via the network interface 58. Alternatively, if the control system 52 is not present, the one or more radio units 60 (if present) are connected to the one or more processing nodes 68 via a network interface(s). Alternatively, all of the functionality of the network node 50 (e.g., all of the functionality of the radio access node 28) described herein may: be implemented in the processing nodes 68. Each processing node 68 includes one or more processors 72 (e.g., CPUs, ASICs, DSPs, FPGAs, and/or the like), memory 74, and a network interface 76.

In this example, functions 78 of the network node 50 (e.g., the functions of the radio access node 28 or transmit node 12) described herein are implemented at the one or more processing nodes 70 or distributed across the control system 52 (if present) and the one or more processing nodes 68 in any desired manner. In some particular embodiments, some or all of the functions 78 of the network node 50 described herein are implemented as virtual components executed by one or more virtual machines implemented in a virtual environment(s) hosted by the processing node(s) 68. As will be appreciated by one of ordinary skill in the art, additional signaling or communication between the processing node(s) 68 and the control system 52 (if present) or alternatively the radio unit(s) 60 (if present) is used in order to carry out at least some of the desired functions. Notably, in some embodiments, the control system 52 may not be included, in which case the radio unit(s) 60 (if present) communicates directly with the processing node(s) 68 via an appropriate network interface(s).

In some particular embodiments, higher layer functionality (e.g., layer 3 and up and possibly some of layer 2 of the protocol stack) of the network node 50 may be implemented at the processing node(s) 68 as virtual components (i.e., implemented "in the cloud") whereas lower layer functionality (e.g., layer 1 and possibly some of layer 2 of the protocol stack) may be implemented in the radio unit(s) 60 and possibly the control system 52.

In some embodiments, a computer program including instructions which, when executed by the at least one processor 54, 72, causes the at least one processor 54, 72 to carry out the functionality of the network node 50 or a processing node 68 according to any of the embodiments described herein is provided. In some embodiments, a carrier containing the aforementioned computer program product is provided. The carrier is one of an electronic signal, an optical signal, a radio signal, or a computer readable storage medium (e.g., a non-transitory computer readable medium such as the memory 56, 74).

Figure 10:
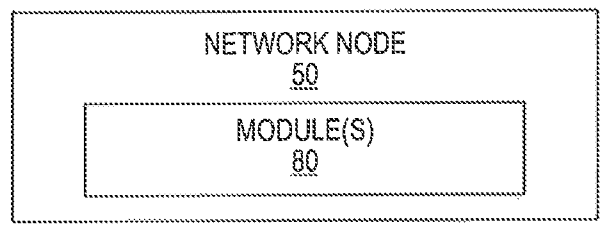

FIG. 10 is a schematic block diagram of the network node 50 (e.g., the radio access node 28) according to some other embodiments of the present disclosure. The network node 50 includes one or more modules 80, each of which is implemented in software. The module(s) 80 provide the functionality of the network node 50 described herein (e.g., the functionality of the transmit node 12 as described herein, e.g., with respect to FIGS. 3 and 4).

Modifications, additions, or omissions may be made to the systems and apparatuses disclosed herein without departing from the scope of the invention. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods disclosed herein without departing from the scope of the invention. The methods may include more, fewer, or other steps. Additionally, steps may be performed in any suitable order.

Although this disclosure has been described in terms of certain embodiments, alterations and permutations of the embodiments will be apparent to those skilled in the art. Accordingly, the above description of the embodiments does not constrain this disclosure Other changes, substitutions, and alterations are possible without departing from the spirit and scope of this disclosure.

Abbreviations used in the preceding description include:

3GPP Third Generation Partnership Project
5G Fifth Generation
ADC Analog-to-Digital Converter
ASIC Application Specific Integrated Circuit
AWGN Additive White Gaussian Noise
BLER Block Error Rate
CPU Central Processing Unit
CRC Cyclic Redundancy Check
DAC Digital-to-Analog Converter
DSP Digital Signal Processor
ceNB Enhanced or Evolved Node B
FPGA Field Programmable Gate Array
gNB New Radio Base Station
LDPC Low-Density Parity-Check
LTE Long Term Evolution
ML Maximum-Likelihood
MME Mobility Management Entity
MTC Machine Type Communication
NR New Radio
P-GW Packet Data Network Gateway
PW Polarization Weight
RX Receive
SC Successive Cancellation
SCEF Service Capability Exposure Function
SCL Successive Cancellation List
TX Transmit
UE User Equipment

The invention claimed is:

1. A method of operation of a transmit node in a wireless communication system, the method comprising:

performing, by a polar encoder, polar encoding of a set of K information bits to thereby generate a set of polar-encoded information bits wherein the polar-encoded information bits are configured to be transmitted by a transmitter to a receiver, and wherein:

the K information bits are mapped to a first Kbit locations in an information sequence $S_N$, the information sequence $S_N$ being a ranked sequence of N information bit locations among a plurality of input bits for the polar encoding, where N is equivalent to a code length;

a size of the information sequence $S_N$ is greater than or equal to K; and the information sequence $S_N$ is optimized for a specific value of the code length (N), wherein N=64, and the information sequence $S_N$ is:

$S_{64}$=[63 62 61 59 55 47 60 31 58 57 54 53 46 51 45 30 43 56 29 39 27 52 50 23 44 49 15 42 28 41 38 26 37 25 22 35 21 14 48 19 13 40 11 36 7 24 34 20 33 18 12 17 10 9 6 5 3 32 16 8 4 2 1 0].

2. A transmit node, comprising:

a polar encoder operable to perform polar encoding of a set of K information bits to thereby generate a set of polar-encoded information bits wherein the polar-encoded information bits are configured to be transmitted by a transmitter to a receiver, and wherein:

the K information bits are mapped to a first Kbit locations in an information sequence $S_N$, the information sequence $S_N$ being a ranked sequence of N information bit locations among a plurality of input bits for the polar encoding, where N is equivalent to a code length;

a size of the information sequence $S_N$ is greater than or equal to K; and the information sequence $S_N$ is optimized for a specific value of the code length (N), wherein N=64, and the information sequence $S_N$ is:

$S_{64}$=[63 62 61 59 55 47 60 31 58 57 54 53 46 51 45 30 43 56 29 39 27 52 50 23 44 49 15 42 28 41 38 26 37 25 22 35 21 14 48 19 13 40 11 36 7 24 34 20 33 18 12 17 10 9 6 5 3 32 16 8 4 2 1 0].

3. The transmit node of claim 2, further comprising a transmitter operable to transmit the set of polar-encoded information bits.

4. The transmit node of claim 2, wherein N=128, and the information sequence $S_N$ is:

$S_{128}$=[127 126 125 123 119 111 124 95 122 121 118 63 117 110 115 109 94 107 93 120 103 91 62 116 61 87 114 108 59 113 79 55 106 92 105 47 102 90 31 101 89 99 60 86 85 58 112 78 57 83 54 77 104 53 75 46 100 51 88 45 71 98 30 43 84 97 29 56 82 39 76 27 81 52 74 23 50 73 44 15 70 49 42 69 28 41 96 67 38 26 37 25 80 22 35 21 14 19 72 13 48 68 11 40 66 7 36 65 24 34 20 33 18 12 17 10 9 6 64 5 3 32 16 8 4 2 1 0].

5. The transmit node of claim 2, wherein N=128, and the information sequence $S_N$ is:

$S_{128}$=[127 126 125 123 119 111 124 95 122 121 118 63 117 110 115 109 94 107 93 120 103 91 62 116 61 87 114 108 59 113 79 55 106 92 105 47 102 90 60 101 89 99 31 86 85 58 112 78 57 83 54 77 104 53 75 46 100 51 88 45 71 98 43 30 84 97 29 39 82 56 76 27 81 52 74 23 50 73 44 49 70 15 42 69 28 41 96 67 38 26 37 25 80 22 35 21 14 48 72 19 13 68 11 40 66 36 7 65 24 34 20 33 18 12 17 10 9 6 64 5 3 32 16 8 4 2 1 0].

6. The transmit node of claim 2, wherein N=128, and the information sequence $S_N$ is:

$S_{128}$=[127 126 125 123 119 111 124 95 122 121 118 63 117 110 115 109 94 107 93 120 103 91 62 116 61 87 114 108 59 113 79 55 106 92 105 47 102 90 60 101 89 99 31 86 85 58 112 78 57 83 54 77 104 53 75 46 100 51 88 45 71 98 30 43 84 97 56 29 82 39 76 27 81 52 74 50 23 73 44 49 70 15 42 69 28 41 96 67 38 26 37 25 80 22 35 21 14 48 72 19 13 68 40 11 66 36 7 65 24 34 20 33 18 12 17 10 9 6 64 5 3 32 16 8 4 2 1 0].

7. The transmit node of claim 2, wherein N=128, and the information sequence $S_N$ is:

$S_{128}$=[127 126 125 123 119 111 124 95 122 121 118 63 117 110 115 109 94 107 93 120 103 91 62 116 61 87 114 108 59 113 79 55 106 92 105 47 102 90 60 101 89 99 31 86 85 58 112 78 57 83 54 77 104 53 75 46 100 51 88 45 71 98 43 30 84 97 29 39 82 27 76 56 81 52 74 23 50 73 15 44 70 49 42 69 41 28 96 67 38 26 37 25 80 22 35 21 14 19 72 13 11 68 48 40 66 7 36 65 24 20 34 33 18 12 10 17 6 9 64 5 3 32 16 8 4 2 1 0].

8. The transmit node of claim 2, wherein N=128, and the information sequence $S_N$ is:

$S_{128}$=[127 126 125 123 119 111 124 95 122 121 118 63 117 110 115 109 94 107 93 120 103 91 62 116 61 114 87 108 59 113 79 106 55 92 105 102 47 90 101 31 89 60 99 86 85 58 112 78 57 83 54 77 104 53 75 46 100 51 88 45 71 98 30 43 84 97 29 56 82 39 76 27 81 52 74 23 50 73 44 15 70 49 42 69 28 41 96 67 38 26 37 25 80 22 35 21 14 19 72 13 48 68 11 40 66 7 36 65 24 34 20 33 18 12 17 10 9 6 64 5 3 32 16 8 4 2 1 0].

9. The transmit node of claim 2, wherein N=128, and the information sequence $S_N$ is:

$S_{128}$=[127 126 125 123 119 111 124 95 122 121 118 63 117 110 115 109 94 107 93 120 103 91 62 116 61 114 87 108 59 113 79 106 55 92 105 102 47 90 101 60 89 31 99 86 85 58 112 78 57 83 54 77 104 53 75 46 100 51 88 45 71 98 43 30 84 97 29 39 82 56 76 27 81 52 74 23 50 73 44 49 70 15 42 69 28 41 96 67 38 26 37 25 80 22 35 21 14 48 72 19 13 68 11 40 66 36 7 65 24 34 20 33 18 12 17 10 9 6 64 5 3 32 16 8 4 2 1 0].

10. The transmit node of claim 2, wherein N=128, and the information sequence $S_N$ is:

$S_{128}$=[127 126 125 123 119 111 124 95 122 121 118 63 117 110 115 109 94 107 93 120 103 91 62 116 61 114 87 108 59 113 79 106 55 92 105 102 47 90 101 60 89 31 99 86 85 58 112 78 57 83 54 77 104 53 75 46 100 51 88 45 71 98 30 43 84 97 56 29 82 39 76 27 81 52 74 50 23 73 44 49 70 15 42 69 28 41 96 67 38 26 37 25 80 22 35 21 14 48 72 19 13 68 40 11 66 36 7 65 24 34 20 33 18 12 17 10 9 6 64 5 3 32 16 8 4 2 1 0].

11. The transmit node of claim 2, wherein N=128, and the information sequence $S_N$ is:

$S_{128}$=[127 126 125 123 119 111 124 95 122 121 118 63 117 110 115 109 94 107 93 120 103 91 62 116 61 114 87 108 59 113 79 106 55 92 105 102 47 90 101 60 89 31 99 86 85 58 112 78 57 83 54 77 104 53 75 46 100 51 88 45 71 98 43 30 84 97 29 39 82 27 76 56 81 52 74 23 50 73 15 44 70 49 42 69 41 28 96 67 38 26 37 25 80 22 35 21 14 19 72 13 11 68 48 40 66 7 36 65 24 20 34 33 18 12 10 17 6 9 64 5 3 32 16 8 4 2 1 0].

12. The transmit node of claim 2, wherein the transmit node is a radio access node in a wireless communication system.

13. The transmit node of claim 2, wherein the transmit node is a wireless communication device in a wireless communication system.

14. A method of operation of a receive node in a wireless communication system, the method comprising:

performing, by a polar decoder, polar decoding of a set of polar encoded information bits to thereby generate a set of K information bits wherein the polar encoded information bits are configured to be transmitted by a wireless transmitter to a receiver, and wherein:

the K information bits are mapped to a first Kbit locations in an information sequence $S_N$, the information sequence $S_N$ being a ranked sequence of N information bit locations among a plurality of input bits for the polar encoding, where N is equivalent to a code length;

a size of the information sequence $S_N$ is greater than or equal to K; and the information sequence $S_N$ is optimized for a specific value of the code length (N), wherein N=64, and the information sequence $S_N$ is:

$S_{64}$=[63 62 61 59 55 47 60 31 58 57 54 53 46 51 45 30 43 56 29 39 27 52 50 23 44 49 15 42 28 41 38 26 37 25 22 35 21 14 48 19 13 40 11 36 7 24 34 20 33 18 12 17 10 9 6 5 3 32 16 8 4 2 1 0].

15. A receive node, comprising:

a polar decoder operable to perform polar decoding of a set of polar encoded information bits to thereby generate a set of K information bits wherein the polar encoded information bits are configured to be transmitted by a wireless transmitter to a receiver, and wherein:

the K information bits are mapped to a first Kbit locations in an information sequence $S_N$, the information sequence $S_N$ being a ranked sequence of N information bit locations among a plurality of input bits for the polar encoding where N is equivalent to a code length;

a size of the information sequence $S_N$ is greater than or equal to K; and the information sequence $S_N$ is optimized for a specific value of the code length (N), wherein N=64, and the information sequence $S_N$ is:

$S_{64}$=[63 62 61 59 55 47 60 31 58 57 54 53 46 51 45 30 43 56 29 39 27 52 50 23 44 49 15 42 28 41 38 26 37 25 22 35 21 14 48 19 13 40 11 36 7 24 34 20 33 18 12 17 10 9 6 5 3 32 16 8 4 2 1 0].

16. The receive node of claim 15, further comprising a receiver operable to receive the set of polar-encoded information bits.

17. The receive node of claim 15, wherein N=128, and the information sequence $S_N$ is:

$S_{128}$=[127 126 125 123 119 111 124 95 122 121 118 63 117 110 115 109 94 107 93 120 103 91 62 116 61 87 114 108 59 113 79 55 106 92 105 47 102 90 31 101 89 99 60 86 85 58 112 78 57 83 54 77 104 53 75 46 100 51 88 45 71 98 30 43 84 97 29 56 82 39 76 27 81 52 74 23 50 73 44 15 70 49 42 69 28 41 96 67 38 26 37 25 80 22 35 21 14 19 72 13 48 68 11 40 66 7 36 65 24 34 20 33 18 12 17 10 9 6 64 5 3 32 16 8 4 2 1 0].

18. The receive node of claim 15, wherein N=128, and the information sequence $S_N$ is:

$S_{128}$=[127 126 125 123 119 111 124 95 122 121 118 63 117 110 115 109 94 107 93 120 103 91 62 116 61 87 114 108 59 113 79 55 106 92 105 47 102 90 60 101 89 99 31 86 85 58 112 78 57 83 54 77 104 53 75 46 100 51 88 45 71 98 43 30 84 97 29 39 82 56 76 27 81 52 74 23 50 73 44 49 70 15 42 69 28 41 96 67 38 26 37 25 80 22 35 21 14 48 72 19 13 68 11 40 66 36 7 65 24 34 20 33 18 12 17 10 9 6 64 5 3 32 16 8 4 2 1 0].

19. The receive node of claim 15, wherein N=128, and the information sequence $S_N$ is:

$S_{128}$=[127 126 125 123 119 111 124 95 122 121 118 63 117 110 115 109 94 107 93 120 103 91 62 116 61 87 114 108 59 113 79 55 106 92 105 47 102 90 60 101 89 99 31 86 85 58 112 78 57 83 54 77 104 53 75 46 100 51 88 45 71 98 30 43 84 97 56 29 82 39 76 27 81 52 74 50 23 73 44 49 70 15 42 69 28 41 96 67 38 26 37 25 80 22 35 21 14 48 72 19 13 68 40 11 66 36 7 65 24 34 20 33 18 12 17 10 9 6 64 5 3 32 16 8 4 2 1 0].

20. The receive node of claim 15, wherein N=128, and the information sequence $S_N$ is:

$S_{128}$=[127 126 125 123 119 111 124 95 122 121 118 63 117 110 115 109 94 107 93 120 103 91 62 116 61 87 114 108 59 113 79 55 106 92 105 47 102 90 60 101 89 99 31 86 85 58 112 78 57 83 54 77 104 53 75 46 100 51 88 45 71 98 43 30 84 97 29 39 82 27 76 56 81 52 74 23 50 73 15 44 70 49 42 69 41 28 96 67 38 26 37 25 80 22 35 21 14 19 72 13 11 68 48 40 66 7 36 65 24 20 34 33 18 12 10 17 6 9 64 5 3 32 16 8 4 2 1 0].

21. The receive node of claim 15, wherein N=128, and the information sequence $S_N$ is:

$S_{128}$=[127 126 125 123 119 111 124 95 122 121 118 63 117 110 115 109 94 107 93 120 103 91 62 116 61 114 87 108 59 113 79 106 55 92 105 102 47 90 101 31 89 60 99 86 85 58 112 78 57 83 54 77 104 53 75 46 100 51 88 45 71 98 30 43 84 97 29 56 82 39 76 27 81 52 74 23 50 73 44 15 70 49 42 69 28 41 96 67 38 26 37 25 80 22 35 21 14 19 72 13 48 68 11 40 66 7 36 65 24 34 20 33 18 12 17 10 9 6 64 5 3 32 16 8 4 2 1 0].

22. The receive node of claim 15, wherein N=128, and the information sequence $S_N$ is:

$S_{128}$=[127 126 125 123 119 111 124 95 122 121 118 63 117 110 115 109 94 107 93 120 103 91 62 116 61 114 87 108 59 113 79 106 55 92 105 102 47 90 101 60 89 31 99 86 85 58 112 78 57 83 54 77 104 53 75 46 100 51 88 45 71 98 43 30 84 97 29 39 82 56 76 27 81 52 74 23 50 73 44 49 70 15 42 69 28 41 96 67 38 26 37 25 80 22 35 21 14 48 72 19 13 68 11 40 66 36 7 65 24 34 20 33 18 12 17 10 9 6 64 5 3 32 16 8 4 2 1 0].

23. The receive node of claim 15, wherein N=128, and the information sequence $S_N$ is:

$S_{128}$=[127 126 125 123 119 111 124 95 122 121 118 63 117 110 115 109 94 107 93 120 103 91 62 116 61 114 87 108 59 113 79 106 55 92 105 102 47 90 101 60 89 31 99 86 85 58 112 78 57 83 54 77 104 53 75 46 100 51 88 45 71 98 30 43 84 97 56 29 82 39 76 27 81 52 74 50 23 73 44 49 70 15 42 69 28 41 96 67 38 26 37 25 80 22 35 21 14 48 72 19 13 68 40 11 66 36 7 65 24 34 20 33 18 12 17 10 9 6 64 5 3 32 16 8 4 2 1 0].

24. The receive node of claim 15, wherein N=128, and the information sequence $S_N$ is:

$S_{128}$=[127 126 125 123 119 111 124 95 122 121 118 63 117 110 115 109 94 107 93 120 103 91 62 116 61 114 87 108 59 113 79 106 55 92 105 102 47 90 101 60 89 31 99 86 85 58 112 78 57 83 54 77 104 53 75 46 100 51 88 45 71 98 43 30 84 97 29 39 82 27 76 56 81 52 74 23 50 73 15 44 70 49 42 69 41 28 96 67 38 26 37 25 80 22 35 21 14 19 72 13 11 68 48 40 66 7 36 65 24 20 34 33 18 12 10 17 6 9 64 5 3 32 16 8 4 2 1 0].

25. The receive node of claim 15, wherein the receive node is a radio access node in a wireless communication system.

26. The receive node of claim 15, wherein the receive node is a wireless communication device in a wireless communication system.

* * * * *